United States Patent [19]

Schaeffer

[11] Patent Number: 4,531,104

[45] Date of Patent: Jul. 23, 1985

[54] TUNABLE MAGNETRON OF THE COAXIAL-VACUUM TYPE

[75] Inventor: Gregory T. Schaeffer, Williamsport, Pa.

[73] Assignee: Litton Systems, Inc., Beverly Hills, Calif.

[21] Appl. No.: 445,122

[22] Filed: Nov. 29, 1982

[51] Int. Cl.³ ........................ H03B 9/10; H01J 25/50

[52] U.S. Cl. .................................. 331/90; 315/39.55; 315/39.61

[58] Field of Search ............................ 331/86, 90, 96; 315/39.51, 39.55, 39.61, 39.57, 39.59; 333/226, 232

[56] References Cited

U.S. PATENT DOCUMENTS 4,131,825 12/1978 Mattsson ...................... 315/39.51 X
4,194,142 3/1980 Gerard ........................ 315/39.51 X
4,371,849 2/1983 Longley ............................... 331/96

FOREIGN PATENT DOCUMENTS 2300263 7/1974 Fed. Rep. of Germany ...... 333/232

*Primary Examiner*—Eugene R. LaRoche
*Assistant Examiner*—Robert J. Pascal
*Attorney, Agent, or Firm*—Gerald L. Cline

[57] ABSTRACT

A tunable, coaxial-vacuum magnetron is shown having a cathode surrounded by an anode within a surrounding evacuated anode cavity. Located between the cathode-anode interaction space and an output from the anode cavity is a tuning mechanism which includes a single symmetrical ceramic tuning rod that is adjusted along its axis into and out of the anode cavity. The adjustment mechanism includes a tuning nut rotatably mounted in a tuning housing which turns to move a threaded shaft along the axis thereof. Separating the threaded shaft from the anode cavity is a bellows attached to the tuning housing and to which is attached the symmetrical tuning rod for sealing the vacuum cavity.

22 Claims, 10 Drawing Figures

TUNABLE MAGNETRON OF THE COAXIAL-VACUUM TYPE

The present invention relates to a tunable magnetron of the coaxial-vacuum type and, more particularly, to an improved tuning device which is used within the evacuated cavity of a coaxial magnetron.

BACKGROUND OF THE INVENTION

Magnetrons are specialized electron tubes characterized by the interaction of electrons within an electric field of a circuit element in crossed, steady electric and magnetic fields to produce an a-c power output. The design of the magnetron determines the frequency of its output of microwave energy.

In some prior art magnetrons, it is desirable to adjust the output frequency over a wide range, such as, 10 to 500 MHz. In this type of magnetron, adjustment is often accomplished by adjusting the size of the cavity by moving one of the cavity walls. See, for example, U.S. Pat. No. 3,119,082 which issued Jan. 21, 1964 by M. W. St. Clair et al.

Not all magnetrons require adjustment over such a wide range. In many cases, it is desirable to operate the magnetron at a single, fixed output frequency. In these situations, a capacitance-, or inductance-tuning device may be introduced into the crossed-field interaction space of the magnetron cavity defined between the cathode and anode thereof. An adjustable cavity is not desirable as such cavities add to the cost of the magnetron.

Where a single output frequency is desired, it is theoretically possible to design a magnetron that requires no adjustment. However, manufacturing tolerances, temperature sensitivity, and other factors require some tuning to adjust the magnetron to the desired output frequency. Other magnetrons are useful with an output which may vary within a narrow range. These magnetrons require no adjustment at all.

An example of a inductance tuning device used in the prior art to place conductive strips or rods between vanes that form the anode of a magnetron is found in U.S. Pat. No. 3,366,833 which issued Jan. 30, 1968 by P. R. Hanson. This patent illustrates a typical vane-and-strap magnetron.

An example of a capacitance tuning device which places conductive plates in, or adjacent to, the interaction space may be found in U.S. Pat. No. 3,600,629 by P. Fenster, et al. which issued Aug. 17, 1971. An example of capacitance tuning in which the conductive plates are remote from the interaction space is found in U.S. Pat. No. 3,379,925 by R. E. Edwards, issued Apr. 23, 1968.

Another prior art magnetron is the coaxial magnetron in which the cathode and anode are coaxially arranged and beyond which a cavity is arranged coaxially about the anode to form an anode cavity. Within the anode cavity is located a rotational tuning device disposed between the anode and an output of the magnetron device. The tuning device consists of a flat, paddle-like ceramic element which may be rotated to expose its edge to the microwave energy within the cavity or to expose one of two flat surfaces for adjusting the output frequency of the magnetron as shown by the curve of FIG. 5*b*. The rotational arrangement of the flag tuner creates some problems. The anode and cathode must be retained within a vacuum. Yet, a rotating element passing through the wall of a vacuum chamber is difficult to seal. In the prior art coaxial magnetron, this sealing problem was overcome by placing a ceramic sleeve about the anode and cathode through which the electrons could pass but which would retain a vacuum in the area of the interaction space. The outer chamber thus formed was then filled with a suitable gas which could be retained under a pressure and which could be more easily sealed from escape through the rotational flag tuner. Such a magnetron is referred to as a sleeve tube magnetron which may be purchased from the Electron Tube Division of Litton Systems, Inc., the assignee herein.

The sleeve tube magnetron requires two chambers, a vacuum chamber and a pressure chamber with a ceramic separation therebetween. Further, the adjustment of the sleeve tube magnetron is very sensitive in that the flag only rotates 90° or one-quarter turn from the minimum output frequency of the magnetron to its maximum output frequency. This makes it difficult to control adjustment of the output frequency.

SUMMARY OF THE INVENTION

Accordingly, objects of the present invention include the provision of a coaxial magnetron which may be more easily and more accurately tuned, which eliminates the need for a two-pressure chamber arrangement, and which is more economical to manufacture and maintain.

To accomplish these objects, there is provided a heated cathode surrounded by a vaned anode within an evacuated coaxial anode cavity. Introduced into the vacuum cavity between the anode and an output of the magnetron is a ceramic rod which is symetrical about its longitudinal axis and which may be adjusted along that longitudinal axis for tuning the output frequency of the magnetron. The tuning rod is provided with an adjustment mechanism which prevents the loss of a vacuum within the cavity and which is easily adjusted to provide fine tuning that, in the preferred embodiment, is 44 times finer than the prior art.

DESCRIPTION OF THE DRAWINGS

Other objects and advantages of the present invention will become apparent after reference to the following detailed description and accompanied drawings, wherein.

BRIEF DESCRIPTION OF THE PREFERRED EMBODIMENT

Figure 1:
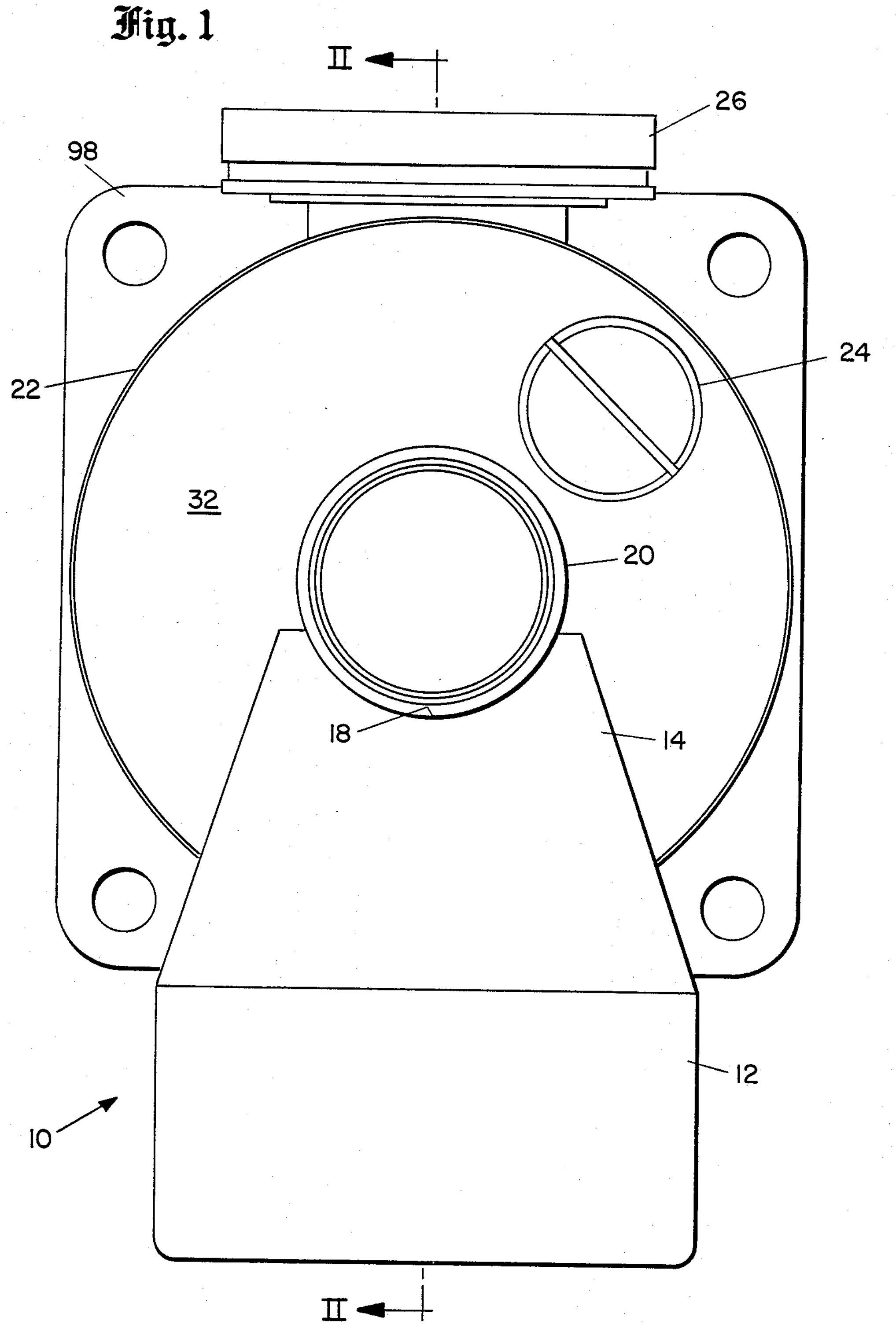
FIG. 1 is a top plan view showing the coaxial magnetron of the present invention.
Figure 2:
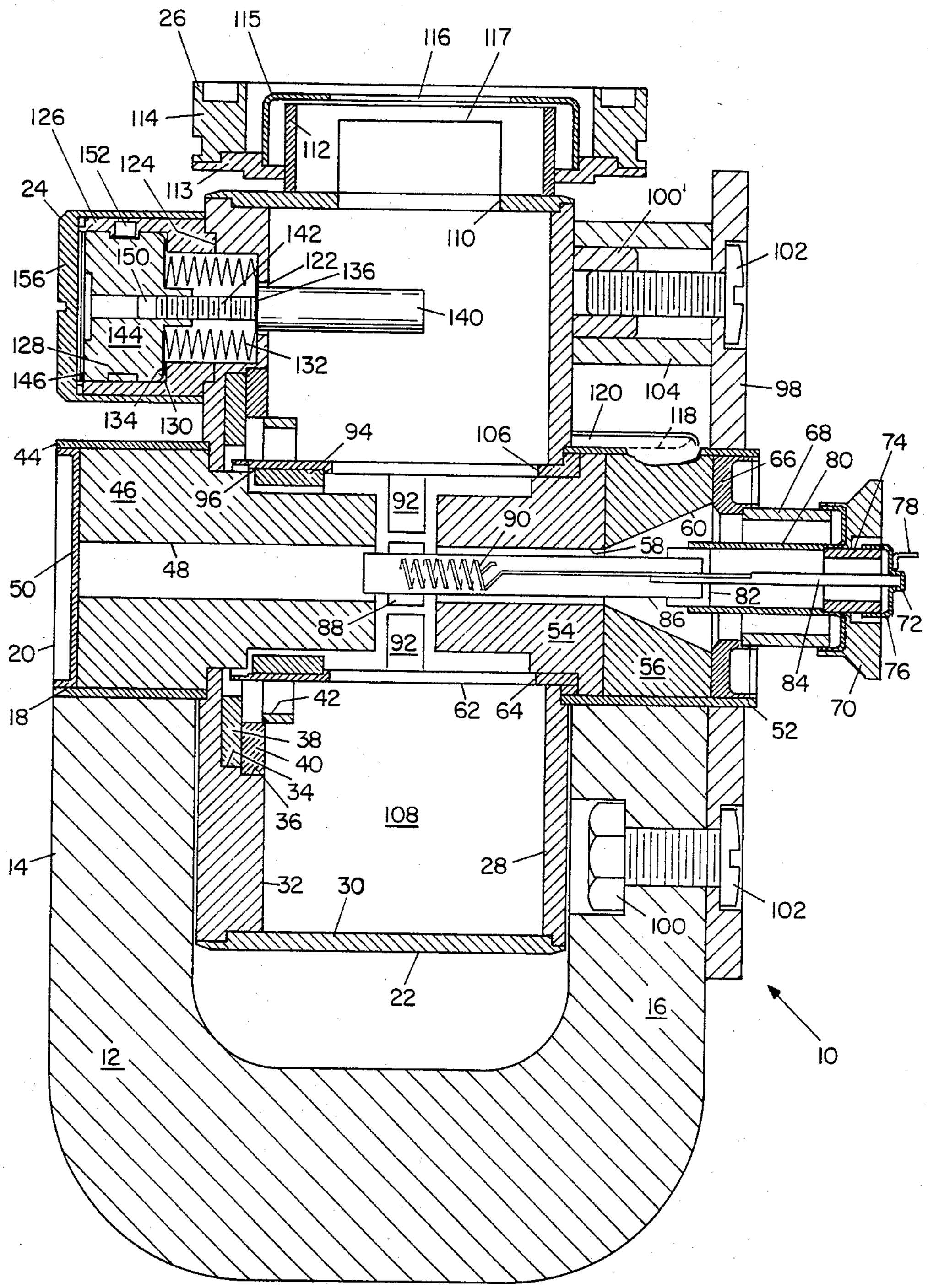
FIG. 2 is a cross-sectional view taking along line II—II of FIG. 1.

A coaxial magnetron 10 is shown in FIGS. 1 and 2 consisting of a permanent magnet 12 which may be formed from an alloy of iron and cobalt known as Alnico-V. The U-shaped magnet 12 includes upwardly directed arms 14 and 16 whose ends are relieved by semicircular depressions 18 which receive a cathode-anode subassembly 20. Subassembly 20 fits within a housing 22 which forms the anode cavity and upon which are mounted a ceramic rod tuning subassembly 24 and an output connector 26. Note that the tuning subassembly 24 is mounted generally between the cathode-anode subassembly 20 and connector 26 but, in the preferred embodiment, is offset approximately 45°.

Referring now to FIG. 2, the housing 22 is shown in cross section including a flat, toroidally, shaped plate 28, which may be formed from corrosion resistant steel and which fits into a cylindrical sleeve 30, constructed from a material having a low coefficient of expansion, such as Invar, which forms the outer periphery of the anode cavity housing. The opposite end of cylindrical sleeve 30 is sealed with a second, toroidally-shaped closure plate 32, also constructed from corrosion resistant steel. Plates 28 and 32 are retained within the sleeve 30 as by welding, and all components are copper plated.

Invar sleeve 30, which is slightly magnetic, might be constructed from a nonmagnetic material in a desired embodiment. However, in the preferred embodiment, a material having a low coefficient of expansion is used, even though the magnetic material might produce a little greater power loss with the magnetron 10.

The center opening of plate 28 receives the first half of the anode subassembly 20, while the central opening of the closure plate 32 receives the second half thereof and the cathode subassembly. The central opening of plate 32 is counterbored from its inside surface to form first and second counterbores 34 and 36 which receive a first ceramic disc 38 and a second copper disc 40, respectively. The inner diameter of the copper disc 40 mounts a copper sleeve 42 which acts as a 1-2-1 choke for the cathode-anode subassembly. The ceramic disc 38 acts as 1-2-1 mode absorber. Disc 38 is retained by brazing disc 40 to plate 32.

The left-hand portion, FIG. 2, of the anode subassembly includes a cylinder 44 of an iron, nickel alloy, known as alloy 52, which is attached within the semicircular relief 18 and magnet arm 14 by conductive bonding which eliminates, as much as possible, any air space therebetween. A first iron pole piece 46 fits tightly within sleeve 44 and passes through the opening within the toroidally-shaped plate 32. Pole piece 46 is relieved by a central bore 48 that provides clearance for the right-hand portion of the cathode-anode assembly 20. The outer end of bore 48 is closed by a cap 50 which is sealed within sleeve 44 by welding.

The right-hand portion of anode assembly 20 includes a second sleeve 52 into which a pair of iron pole pieces 54 and 56 are inserted. Pole piece 54 is provided with a longitudinal bore 58, while pole piece 56 is provided with a tapering bore 60. The inner end of sleeve 52 mounts a third sleeve 62 which forms the anode and which passes through the opening in the toroidally-shaped plate 28 where it is retained by brazing. The pole piece 54 has a shoulder 64 that retains it in the inner diameter of sleeve 62. The outer end of sleeve 52 is sealed by a disc-shaped cap 66 which mounts a ceramic sleeve 68 that, in turn, is sealed by a cap 70 to form a cathode input terminal. Mounted within the center of cap 70 is a heater terminal 72 which comprises a ceramic bushing 74 over which is fitted a conductive cap 76 which mounts an input clip 78. A flanged inner sleeve 80 has an inner bore which receives the ceramic bushing 74 and a rolled flange that fits over the ceramic sleeve 68. The inner end of sleeve 80 is closed by a plug 82 which supports a conductive pin 84 that passes between plug 82 and the cap 76 through the longitudinal axis of sleeve 80. The plug 82 receives a cylindrical tube 86 which extends through the bores 58 and 60 of pole pieces 54 and 56 into the space between pole pieces 46 and 54. The tube 86 mounts an emitter ring of emission material 88 which forms the cathode. Cathode 88 is heated by a helical coil 90 made from a high temperature material, such as tungsten, disposed within the center of sleeve 86 and attached to the pin 84 as by welding.

Disposed within the spacing between pole pieces 46 and 54 are a plurality of anode vanes 92 which are coaxially arranged in equal spaces about the cathode ring 88. In the preferred embodiment, there are 24 vanes 92 attached to the sleeve 62 as by brazing. The left-hand opening of sleeve 62 is relieved to receive a cylindrically-shaped ceramic sleeve 94 which is retained within the sleeve 62 by staking the inner surface of the sleeve at 96.

A mounting plate 98 is attached to the magnet 12 and outer surface of the toroidally-shaped plate 28 by nuts and bolts 100 and 102, respectively. It will be noted that the nut 100 which mounts the magnet 12 to the plate 98 may be a standard nut, while the nut 100' is a specialized nut attached to the plate 28 by brazing. Surrounding the nut 100' is a copper block 104 used to transfer heat from the anode cavity housing 22 to the plate 98.

In alternate spaces between the anode vanes 92, a slot 106 is provided in the sleeve 62 to permit the escape of the electrons from the interaction space, formed between cathode 88 and anode vanes 92, into an anode cavity 108, formed between plates 28 and 32 and sleeves 30 and 62. The output of the anode cavity 108 is provided by a iris 110 in sleeve 30 about which is disposed the output connector 26.

Output connector 26 consists of a cast housing 112 connected to the outside of sleeve 30 by brazing. A connector flange 113 is connected to housing 112 and mounts a connector flange 114 to which may be connected a suitable microwave connector, not shown. A vacuum sealing cup 115 mounts upon flange 113 and fits over flange 112. Mounted within cup 115 over the output iris 110 is a dielectric window 116, such as 707 Corning Glass. Cast housing 112 includes a conductive block 117 which, in combination with housing 112, acts as a transformer to couple the microwave energy from cavity 108 to the waveguide, not shown.

The anode cavity 108 is provided with an exhaust tubulation 118 to which is connected a suitable vacuum pump which is used to evacuate the anode cavity to a vacuum between $2 \cdot 10^{-7}$ to $1 \cdot 10^{-9}$ torr. Once the evacuation is completed, tubulation 118 is pinched closed and rubber closure 120 inserted over the tube 118.

In operation, a negative potential is applied to the coaxial magnetron at cathode input terminal 70. This negative voltage, for example, is minus 5000 pulsed volts d-c. A heating voltage of plus 6.3 volts d-c, compared to terminal 70, is applied to heater terminal 76 via clip 78. By pulsing the magnetron 10 at a suitable rate, the electrons begin to spin off from the cathode 88 into the magnetic field formed coaxially along the axis of the cathode 88. As the electrons enter the magnetic field under the influence of the pulsed electric field, a spoked pattern is created between alternate vanes 92, which moves from vane to vane, as is known in the art. Some of these electrons pass through the spaces between the vanes 92, through the openings 106, and into the anode cavity 108, where the microwave energy is emitted through iris 110 and window 116 of the output connector 26.

Coaxial-vacuum magnetrons may be designed to oscillate at a particular microwave frequency. However, due to thermal expansion, manufacturing tolerances, material and other variations, it is impossible to design a magnetron for production manufacture that will have the precise output frequency desired. To overcome this problem, prior art magnetrons are provided with tuning devices. As mentioned above, it is not uncommon to utilize a conductive device in the space between the anode vanes. Another tuning method utilizes a tuning ring adjacent to the vanes.

Figure 5A:
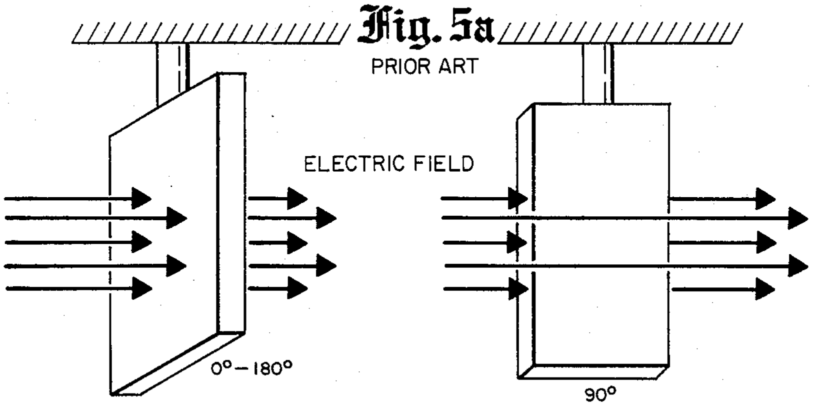
Fig. 5a PRIOR ART
FIG. 5*a* illustrates a prior art tuning mechanism.

The prior art magnetron manufactured by the assignee of the present invention utilized a rotating flag or paddle, such as that shown in FIG. 5*a*. The paddle was disposed within the anode cavity between the cathode-anode interaction space and the output window. In order to utilize a paddle adjusted by a rotating motion, it was necessary to separate the cathode-anode assembly 20 from the anode cavity 108 by a ceramic tube. In this arrangement, the cathode-anode assembly 20 could be evacuated while the anode cavity 108 was pressurized with a suitable gas introduced therein.

The present invention was born of a desire to eliminate the pressurized-anode cavity and the ceramic tube required to separate the anode cavity from the vacuum cavity. It was also desired to improve the tuning sensitivity of the magnetron and to reduce its costs. As a rotating joint passing into a vacuum cavity is not easily sealed, it is necessary to design a joint which can be vacuum sealed. The ceramic rod tuning subassembly 24 of FIG. 3 meets these requirements.

Figure 3:
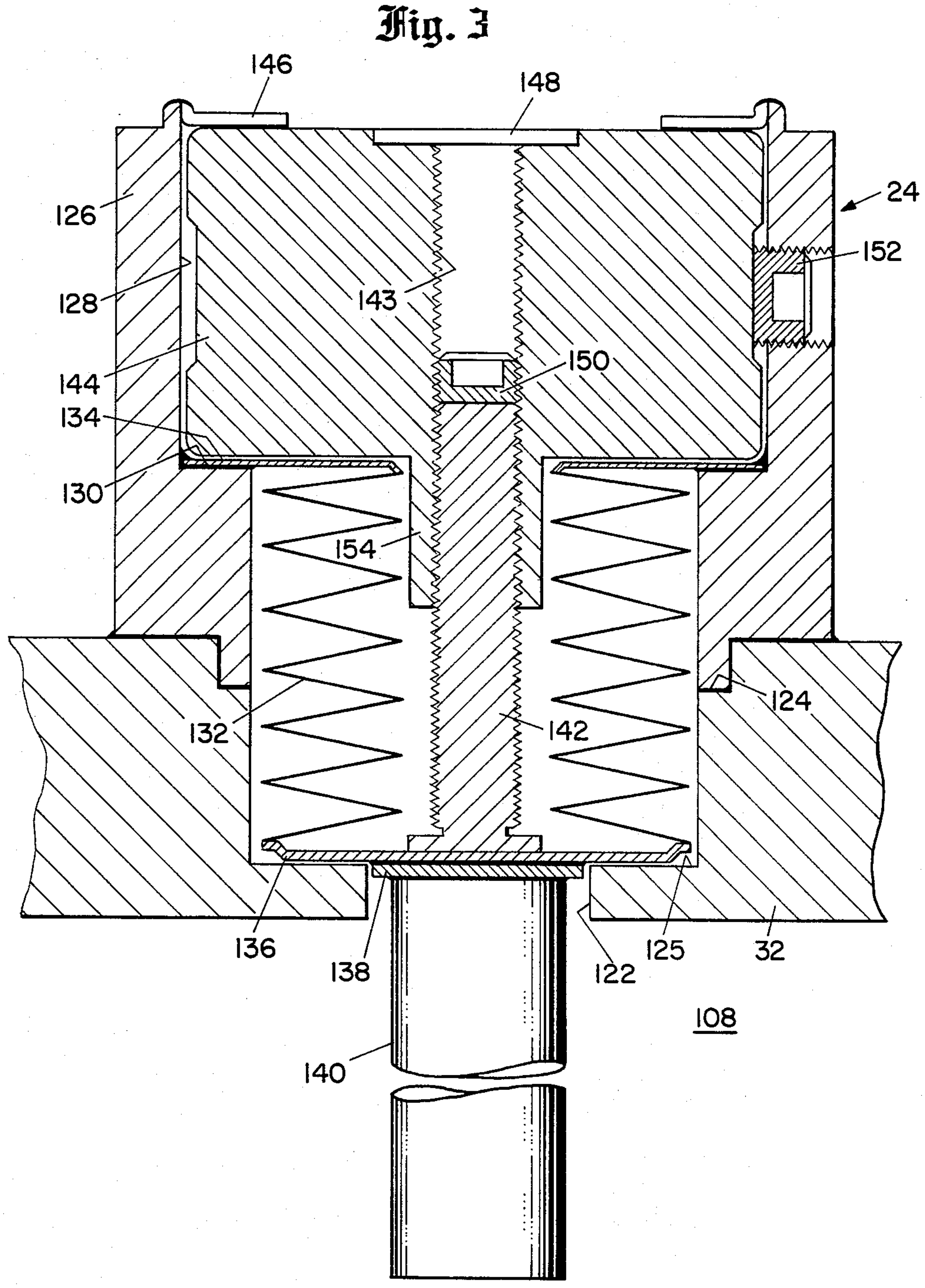
FIG. 3 is an enlarged detail showing the tuning mechanism of the present invention.
Figure 6A:
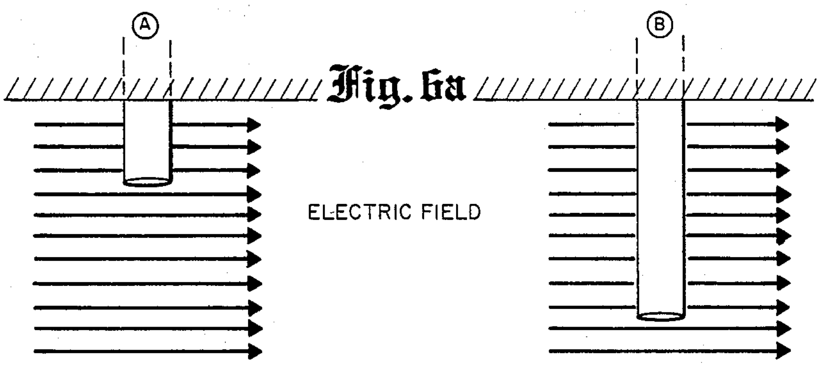
FIG. 6*a* is a schematic illustration of the tuning mechanism of the present invention.

The subassembly 24 is formed by boring a passageway 122 through the closure plate 32 having two shoulders 124 and 125 thereon. The first shoulder 124 receives a tuning housing formed from a copper, nickle alloy sleeve 126 which is retained within passageway 122 against the shoulder 124 by brazing. The sleeve 126 has a central bore 128 which is counterbored to form a shoulder 130. A metal bellows 132 having an upper flange 134 is introduced into bore 128 and is retained therein by attaching flange 134 to shoulder 130 by brazing. The lower portion of the bellows 132 is closed by a bellows-closure plate 136 which, in turn, has a ceramic rod mounting plate 138 brazed to its outer surface. A ceramic rod 140 attaches to the mounting plate 138 by brazing. The ceramic rod extends from the bottom of the bellows 132 through the aperture 122 into the vacuum anode cavity 108 to block the passage of electrons from the cathode-anode interaction space through the iris 110. As seen in FIGS. 2, 3, and 6*a*, the rod 140 fully extended into the cavity 108 will intercept the electric field, change the effective dielectric constant of the cavity, and thus lower the output frequency of the microwave energy emanating through the iris 110 and window 116. By moving the rod 140 from right to left, FIG. 2, or raising it, FIG. 6*a*, the electrons passing toward the iris 110 are accelerated for increasing output frequency.

Referring once again to FIG. 3, it will be seen that a threaded shaft 142 is attached to the inner surface of closure plate 136 and extends up into a threaded passageway 143 within a tuning nut 144. The nut is retained within the bore 128 of housing sleeve 126 by a stop 146 which is welded to the inner surface of bore 128. Stop 146 prevents the nut 144 from being removed from sleeve 126 and acts to stop the adjustment of rod 140 at the low frequency extreme of its adjustment, as shown. A screwdriver slot 148 may be found in the top of nut 144 to provide for the easy rotation of the nut. Indicia upon the nut 148 and stop 146 provides an easy reference to indicate the position of the rod 140 before and after tuning adjustment. In order to adjust the rod 140, a pair of set screws 150 and 152 are loosened from their position where they jam the top of threaded shaft 142 and the side of tuning nut 144, respectively. The nut 144 may be turned until the rod 140 has been raised to a point where the upper portion of closure plate 136 engages a threaded extension 154 of nut 144. This extended surface 154 provides a high frequency stop for preventing the further removal of rod 140 from anode cavity 108.

After the rod 140 has been adjusted along its longitudinal axis to the appropriate point that establishes the output frequency of the magnetron, the set screws 150 and 152 are tightened to lock the rod 140 and its threaded shaft 142 and the nut 144 into a position desired against shock and vibration. Note that the longitudinal axis of rod 140 parallels the axis of the cathode 88 and anode 92. After adjustment, a threaded brass cap 156, FIG. 2, is placed over the threaded exterior of tuning housing 126 for completing the assembly of the magnetron. Also, note that the anode 92 of the magnetron 10 is maintained at ground potential to permit such adjustment.

Figure 4:
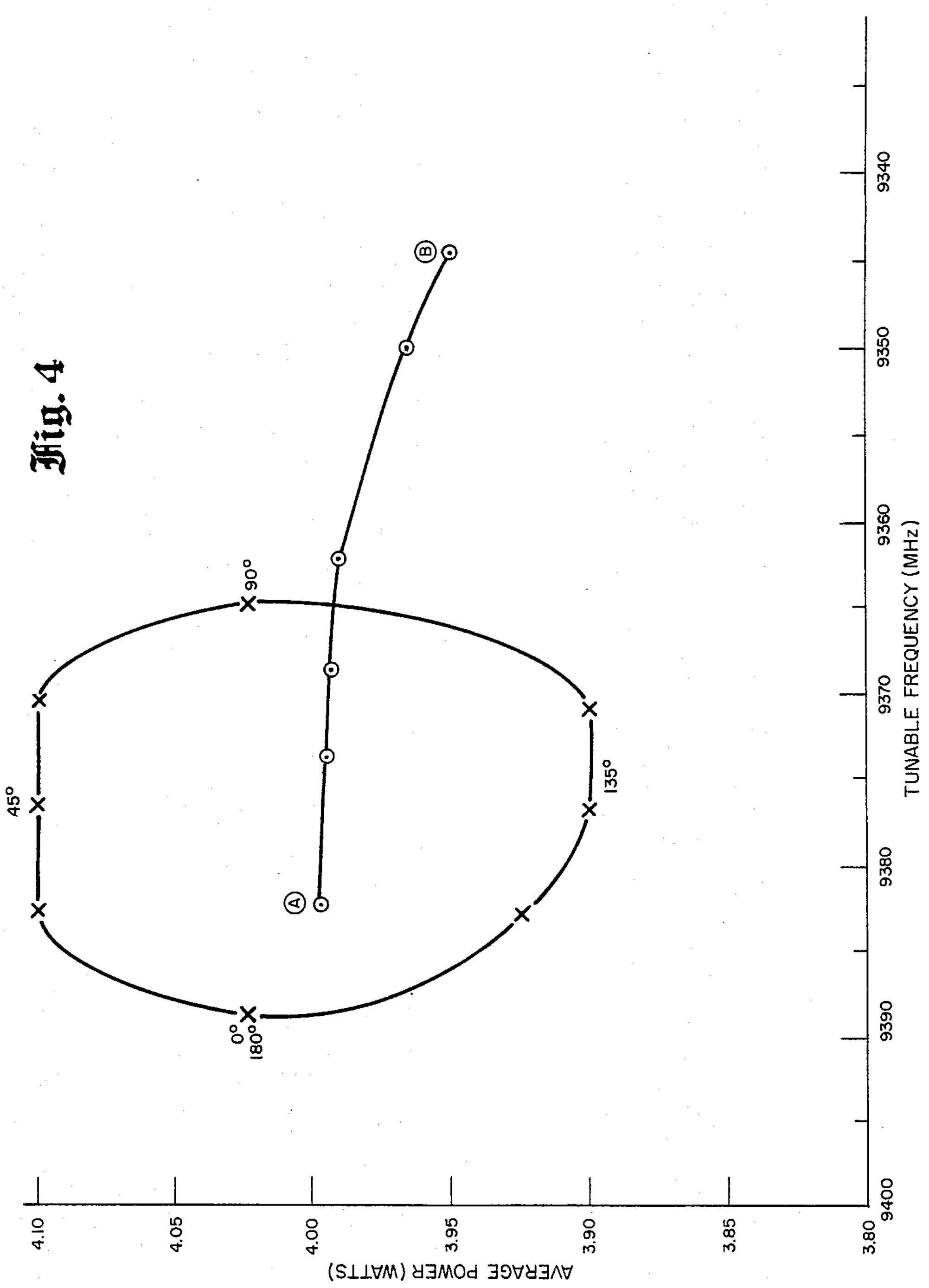
FIG. 4 is a graph showing the tunable frequency of a coaxial magnetron in MHz versus the average power output in watts.

As seen in FIG. 4, the longitudinal adjustment of the ceramic rod 140 produces very little change in the power output of magnetron 10 between points "A" and "B". Point "A" shows the rod 140 extended approximately 0.221 inches into cavity 108 while point "B" shows the rod fully extended to 0.602 inches, FIG. 6*b*. This is in comparison to the power output of a magnetron using the prior art paddle shown by the circular curve in FIG. 4, wherein the power output varies considerably.

Figure 7:
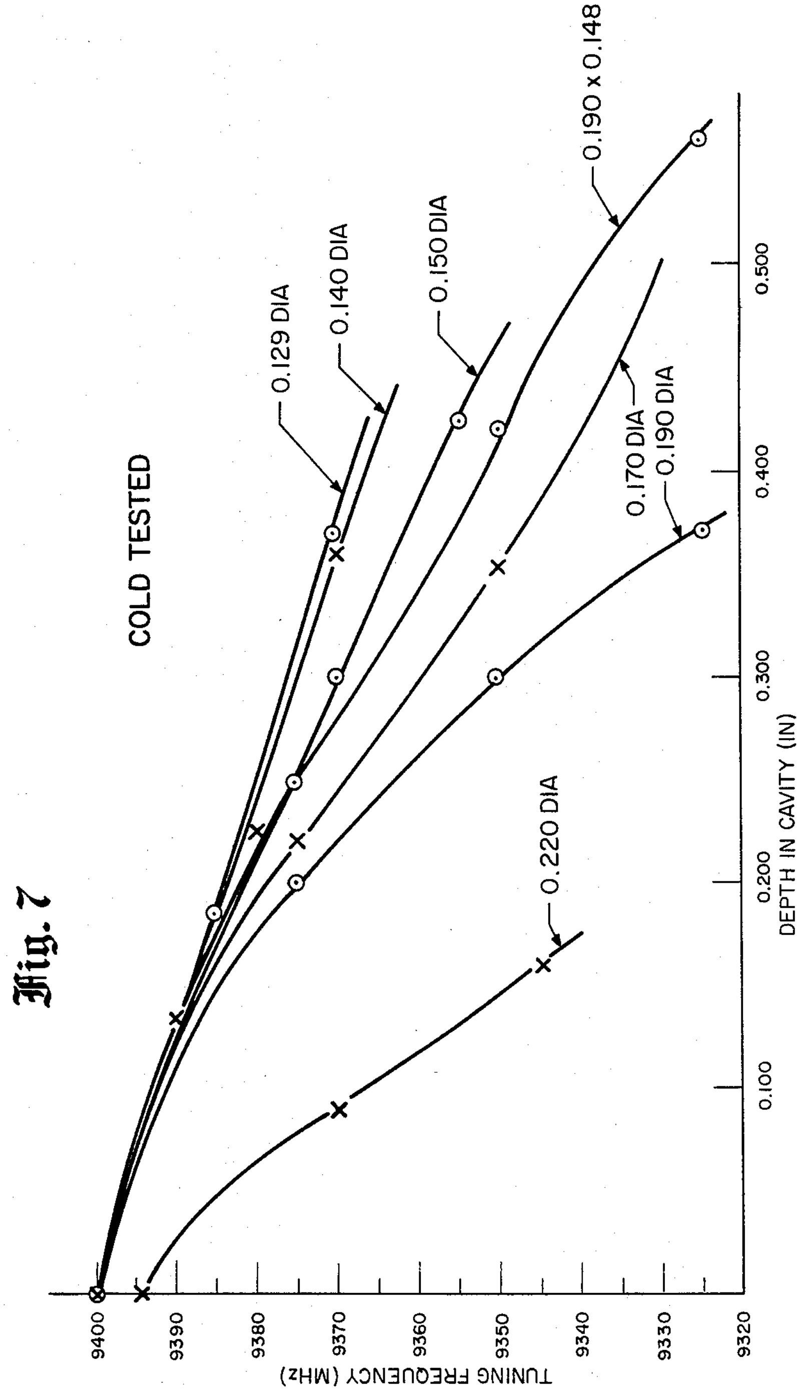
FIG. 7 is a graph showing the depth in cavity of several tuning rods versus the tuning frequency in MHz.
Figure 8:
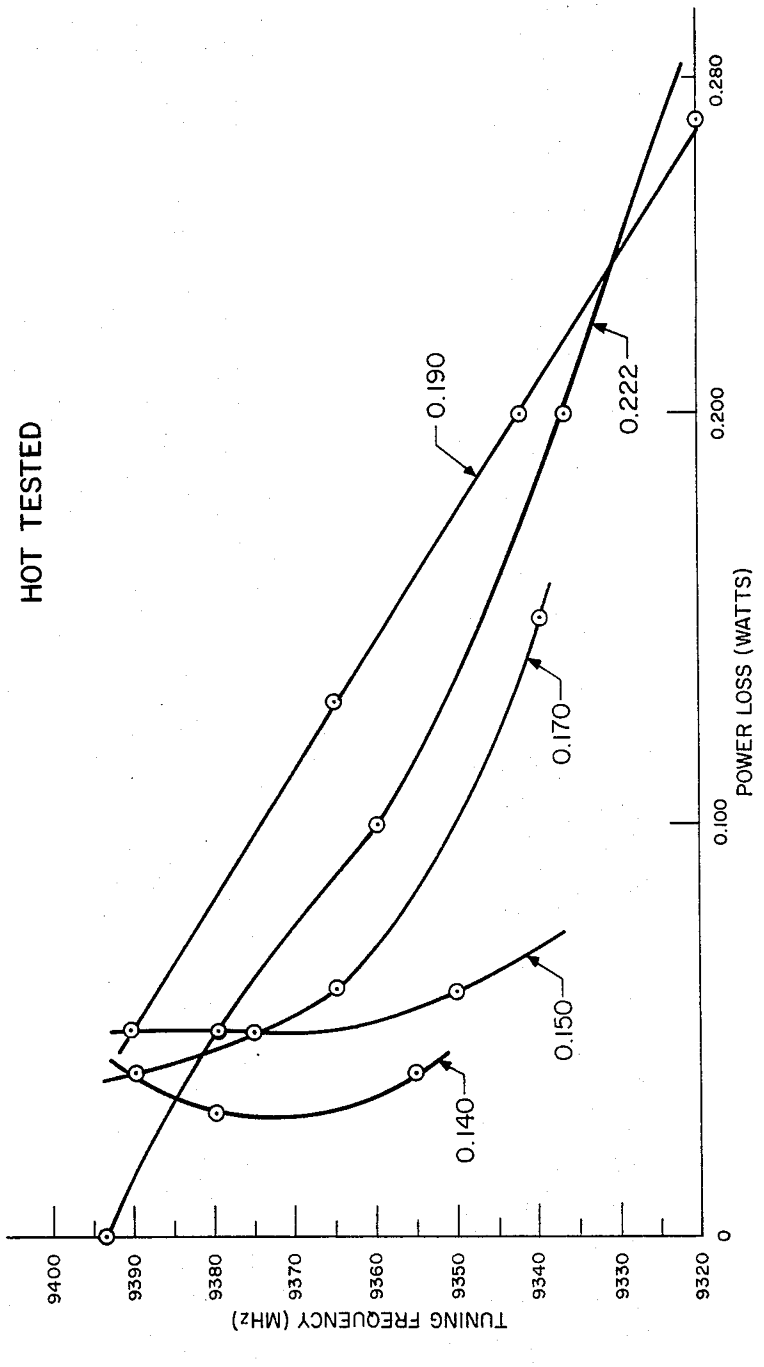
FIG. 8 is a graph showing power loss in watts versus the tuning frequency in MHz.

In the preferred embodiment, it has been found that the ceramic rod 140 has a preferred diameter of 0.15 inches. By referring to FIG. 7, it will be seen that the smaller the diameter of the rod, the smaller the effect of rod displacement upon the output frequency of the magnetron 10. However, reference to FIG. 8 shows that a rod between 0.14 and 0.15 inches produces a more efficient adjustable device, in that the power loss of the magnetron is substantially reduced. A 0.15 inch diameter rod was chosen as it requires 50% less adjustment than the 0.14 inch diameter rod to obtain the same frequency shift and retains a minimum power loss.

Figure 5B:
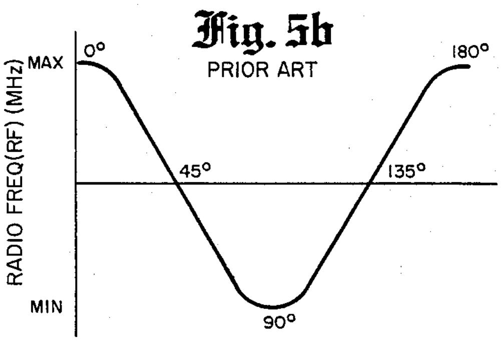
Fig. 5b PRIOR ART
FIG. 5*b* is a graph showing displacement in degrees versus RF frequency in MHz of the mechanism shown in FIG. 5*a;*
Figure 6B:
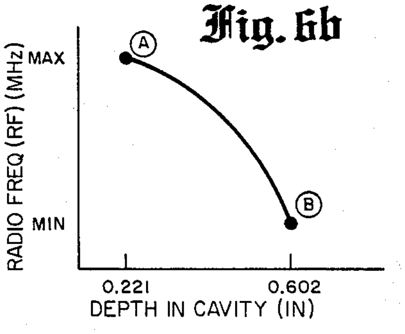
FIG. 6*b* is a graph showing the depth in cavity of a tuning rod in inches versus the RF output of the magnetron in MHz.

By comparison of FIGS. 5*b* and 6*b*, it will be seen that rotation of the prior art paddle tuning device accomplished its maximum adjustment through 90° or one-quarter of a turn, FIGS. 4 and 5*b*. In the preferred embodiment, FIG. 6*b*, the tuning nut 144 may be turned 11 times between position "B" where the rod 140 is fully extended into the cavity 108, and position "A"

where it is fully retracted. Thus, if the tuning device of the present invention is designed to adjust the magnetron 10 through a frequency range of 30 MHz, it will be seen that each full turn of tuning nut 144 adjusts the magnetron 2.7 MHz. This is a 44 to 1 improvement over the sensitivity of the prior art arrangement which required only one-quarter turn for full adjustment.

The present invention also eliminates the need for a ceramic sleeve between the cathode-anode interaction space and anode cavity 108. In the preferred embodiment, the full cavity 108 may be maintained at a vacuum. The rod 140 is ceramic in the preferred embodiment; however, a conductive rod may be used in some applications. While other modifications will become apparent, the present invention should be limited only by the appendant claims.

I claim:

1. A tunable coaxial magnetron, comprising:

cathode means;

anode means including vaned anodes surrounding said cathode means to define an interaction space therebetween;

housing means surrounding said anode means forming a cavity thereabout;

said anode means having apertures between selected vaned anodes for operating said interaction space to said cavity;

a tuning housing mounted upon said housing means;

a tuning nut rotatably retained within said tuning housing;

a threaded shaft passing through said tuning housing;

bellows means mounted within said tuning housing for enclosing said threaded shaft; and an elongated tuning member attached to said bellows means having an axis in said elongated direction along which said tuning member is adjusted into and out of said cavity by rotation of said tuning nut for adjusting the output frequency of said coaxial magnetron.

2. A tunable, coaxial magnetron, as claimed in claim 1, wherein:

said elongated tuning member includes a tuning rod substantially symmetrical about said axis.

3. A tunable, coaxial magnetron, as claimed in claim 1, wherein:

said housing means is evacuated to evacuate said interaction space, said cavity, and said apertures therebetween.

4. A tunable, coaxial magnetron, as claimed in claim 1, wherein:

said tuning nut may be rotated more than ten full turns to adjust said tuning member between its maximum extension into said cavity and its minimum withdrawal out of said cavity.

5. A tunable, coaxial magnetron, as claimed in claim 1, wherein:

said tuning nut adjusts the outout frequency of said magnetron approximately 2.7 MHz per turn over an adjustable output range of 30 MHz.

6. A tunable, coaxial magnetron, as claimed in claim 1, additionally comprising:

an output connector mounted upon the periphery of said housing means;

said housing means having a housing aperture which is aligned with said output connector;

said tuning housing mounted upon the periphery of said housing means to place said elongated tuning member approximately between said interaction space and said housing aperture.

7. A tunable coaxial magnetron, as claimed in claims 1, wherein:

said housing means includes a toroidally-shaped base plate and a toroidally-shaped cover plate jointed by a tubularly-shaped peripheral housing;

said base and cover plates are a corrosion resistive material; and said tubularly-shaped peripheral housing is a material having a low coefficient of thermal expansion.

8. A tunable, coaxial magnetron, as claimed in claim 2, wherein:

said tuning rod is a rod of ceramic material.

9. A tunable, coxial magnetron, as claimed in claim 2, wherein:

said tuning rod is a symmetrical rod having a 0.15 inch diameter.

10. A tunable, coaxial magnetron, as claimed in claim 1, additionally comprising:

means for locking said tuning nut mounted within said tuning housing; and means for locking said threaded shaft within said tuning nut wherein said elongated tuning member is protected from shock and vibration.

11. An improved tuning mechanism for an evacuated coaxial magnetron having a cathode-anode interaction space and a surrounding anode cavity, comprising:

a tuning housing mounted upon said magnetron;

bellows means having first and second end surfaces with said first surface mounted within said tuning housing;

closure means mounted on said second surface of said bellows means;

a single, substantially symmetrical tuning member attached to said closure means mounted on said bellows means and extending into said anode cavity;

a tuning nut rotatively mounted within said tuning housing; and threaded shaft means passing through said rotatable tuning nut and mounted within said bellows means against said closure means wherein rotation of said tuning nut adjusts said threaded shaft means for adjusting said bellows and said tuning member attached to said bellows into and out of said anode cavity.

12. An improved tuning mechanism, as claimed in claim 11, wherein:

said bellows means includes a tubular hollow bellows having a flanged member on said first end surface; and said tuning housing including an inner shoulder upon which said flanged member of said bellows means is mounted.

13. An improved tuning mechanism, as claimed in claim 13, wherein:

said tuning member is a ceramic rod.

14. An improved tuning mechanism, as claimed in claim 13, wherein:

said ceramic rod has a diameter of 0.15 inches.

15. An improved tuning mechanism, as claimed in claim 11, additionally comprising:

threaded locking means mounted within said tuning housing for locking said tuning nut; and threaded locking means mounted within said tuning nut for locking said threaded shaft means to protect said tuning mechanism from shock and vibration.

16. An improved tuning mechanism, as claimed in claim 11, additionally comprising:

threaded cap means secured over said tuning housing to protect said tuning mechanism.

17. An improved tuning mechanism, as claimed in claim 11, additionally comprising:

stop means extending from said tuning nut coaxially with said threaded shaft means for stopping said threaded shaft as said shaft withdraws said tuning member from said cavity.

18. An improved tuning mechanism, as claimed in claim 11, additionally comprising:

stop means extending from said tuning housing over said tuning nut for stopping said threaded shaft as said shaft inserts said tuning member into said cavity.

19. A tunable, coaxial magnetron, comprising:

a cathode located along a central axis of said magnetron;

a permanent magnet for generating a magnetic flux field;

pole pieces for directing said magnetic flux field across said cathode in parallel to said central axis;

a plurality of vaned anodes surrounding said cathode to form an interaction space therebetween;

a housing forming an evacuated anode cavity surrounding said vaned anodes;

passageways communicating between said interaction space and said anode cavity;

terminal means for connecting said cathode to a negative, pulsating potential while maintaining said anodes at ground potential for generating an electric field between said cathode and anodes, crossed to said central axis;

said anode cavity having an output;

adjustable tuning means mounted in juxtaposition with said anode cavity;

said adjustable tuning means including:

a tuning housing;

a tuning nut rotably mounted within said tuning housing;

a bellows mounted within said tuning housing;

a tuning member attached to said bellows and extending into said anode cavity along an axis parallel to said central axis and generally between said interaction space and said output;

a threaded shaft passing through said tuning nut and attached to said bellows;

wherein rotation of said tuning nut adjusts said tuning member into and out of said anode cavity for adjusting the output frequency of said magnetron.

20. A tunable, coaxial magnetron, as claimed in claim 19, wherein:

said tuning member is a generally symmetrical rod.

21. A tunable, coaxial magnetron, as claimed in claim 20, wherein:

said tuning rod is a ceramic rod having a diameter of 0.15 inches.

22. A tunable, coaxial magnetron, as claimed in claim 20, additionally comprising:

threaded locking means mounted within said tuning housing for locking said tuning nut; and threaded locking means mounted within said tuning nut for locking said threaded shaft.

* * * * *